United States Patent [19]

Graeme

[11] 4,229,692

[45] Oct. 21, 1980

[54] LINEAR LOW DRIFT BRIDGE AMPLIFIER

[75] Inventor: Jerald G. Graeme, Tucson, Ariz.

[73] Assignee: Burr-Brown Research Corporation, Tucson, Ariz.

[21] Appl. No.: 954,341

[22] Filed: Oct. 25, 1978

[51] Int. Cl.³ .................................... G01R 27/02
[52] U.S. Cl. ............................... 324/62; 324/65 R; 324/DIG. 1
[58] Field of Search ............ 324/62 R, DIG. 1, 65 R; 73/362 AR

[56] References Cited

U.S. PATENT DOCUMENTS 3,651,696  3/1972  Rose .............................. 73/362 AR Primary Examiner—Ernest F. Karlsen
Attorney, Agent, or Firm—Cahill, Sutton & Thomas

[57] ABSTRACT

A transducer bridge amplifier system includes a first operational amplifier having positive and negative inputs connected, respectively, to first and second output nodes of the bridge. The output of the operational amplifier is connected to a third node of the transducer bridge. A transducer of the transducer bridge is connected between the second node and the third node. A second operational amplifier has its positive input connected to ground and its negative input connected to the first node. A feedback resistor is coupled between the output of the second amplifier and a negative input of the second amplifier. An output signal produced by the second operational amplifier has a linear response to transducer deviation and low sensitivity to offset voltages of the first and second operational amplifiers. In a second alternate embodiment of the invention, the second operational amplifier has its output and its negative input connected to a negative terminal of a voltage supply biasing the transducer bridge amplifier system. The second operational amplifier has its positive input connected to the first node. The current flowing into the bridge system via the first node has linear response to transducer deviation and low sensitivity to affect voltages of the first and second operational amplifiers substantially independently of any impedance connected to the first node. In a third embodiment of the invention, the second operational amplifier can be omitted. A constant current source, rather than a constant voltage source, is used to bias the transducer bridge amplifier system. The current flowing into the first node biases linear response to transducer deviation and low sensitivity to offset voltage of the first operational amplifier.

10 Claims, 4 Drawing Figures

LINEAR LOW DRIFT BRIDGE AMPLIFIER

BACKGROUND OF THE INVENTION

1. Field of the Invention:

The invention relates to bridge amplifiers, and more particularly, to bridge amplifiers having: (1) linear output response to large transducer deviations; and (2) low output sensitivity to input offset voltages and input offset voltage thermal drift of amplifiers contained in the bridge amplifier circuitry.

2. Description of the Prior Art:

Transducer bridges are widely used to sense deviations or variations in resistance in many types of transducers. One of the most common applications for transducer bridges is in the area of sensing transducer deviation of strain gauges. Another typical application is for sensing photoresistive transducers which are responsive to varying light intensities. Numerous transducer bridges and bridge amplifier circuits (also referred to herein as bridge monitor circuits) are well known. Unfortunately, most of the known bridge amplifier circuits have linear output response only for a very small transducer deviation. Consequently, the known bridges and bridge amplifier circuits require expensive, specialized compensation networks in order to provide more linear operation. This results in undue circuit complexity, cost, and loss of reliability.

It is therefore an object of the invention to provide a low cost bridge amplifier circuit having a linear output response to transducer deviation for a substantially wider range of transducer deviation than the bridge amplifiers of the prior art.

One known bridge amplifier produces an output voltage which is directly proportional to the transducer deviation even for large fractional changes in the transducer resistance. This bridge amplifier circuit is disclosed in FIG. 6.10 of "Operational Amplifiers; Design and Applications", authored by the present inventor, G. Tobey, and L. Huelsman, McGraw-Hill, 1971, and incorporated herein by reference to show the state of the art for bridge amplifiers and for operational amplifiers, which are commonly used in bridge amplifiers. Unfortunately the above mentioned linear bridge amplifier circuit has extremely low gain, so that a second stage amplifier is required, and it requires modification of the bridge configuration, so present commercially available bridges cannot be used.

It is therefore another object of the present invention to provide a high gain bridge amplifier having linear output response to large deviations in transducer resistance.

The above mentioned linear wide-deviation bridge amplifier, when utilized with a subsequent amplifying stage to obtain the amount of gain necessary for most applications, has a high sensitivity to the input offset voltages of both of the operational amplifiers required therein, and consequently also has high sensitivity to thermal drift of the input offset voltage of such operational amplifiers. Compensation for the input offset voltages is expensive, and does not effectively avoid the effects of thermal drift of the input offset voltages. Use of chopper-stabilized operational amplifiers are required in the known bridge amplifier circuits in order to obtain low thermal drift response. Suitable chopper-stabilized amplifiers cost approximately $85.00 apiece at the present time. Therefore, bridge amplifiers which are both linear for large transducer deviations and which have low sensitivity to thermal input offset voltage drift are exceedingly, and in many cases, prohibitively expensive. There is clearly an unmet need for a low cost, linear, drift insensitive bridge amplifier.

One prior patent, U.S. Pat. No. 3,651,696, discloses a non-linear bridge circuit designed to produce a linear output response to temperature variations in a platinum resistance thermometer. Platinum resistance thermometers have a highly non-linear temperature-to-transducer deviation relationship. The circuit described in U.S. Pat. No. 3,651,696, provides circuitry to produce a non-linear response of the bridge amplifier output to transducer resistance deviation of the platinum resistor in order to obtain a linear output response with respect to temperature. The structure of the bridge amplifier is similar in certain respects to that of the presently disclosed invention, but the patent teaches away from the present invention by producing a non-linear, rather than a linear output response to deviations in transducer resistance. Further, the structure taught lacks the desired reduced drift sensitivity.

Other patents uncovered by a novelty search directed to the present invention but deemed less relevant to the present include U.S. Pat. Nos.: 3,597,676; 3,754,442; 3,817,104; 3,887,864; 3,986,393; and, 4,060,714.

SUMMARY OF THE INVENTION

Briefly described, and in accordance with one embodiment thereof, the invention provides transducer bridge amplifier circuitry which produces a linear output response to large as well as small deviations in transducer resistance. The transducer bridge amplifier circuitry also has very low sensitivity to input offset voltages of operational amplifiers contained in the transducer bridge amplifier circuitry. The transducer bridge amplifier circuitry includes a first operational amplifier having positive and negative inputs connected to first and second nodes of the transducer bridge, the first and second nodes being output nodes of the transducer bridge. The output of the first operational amplifier is connected to a third node of the transducer bridge, the third node being coupled to the second node by means of a transducer of the transducer bridge, thereby providing negative feedback for the first operational amplifier. The first node of the transducer bridge is connected to a circuit which provides a low impedance or virtual ground. In the described embodiment of the invention, the source of low impedance virtual ground voltage includes a second operational amplifier having a positive input connected to a ground voltage conductor and a negative input connected to said first node. The output of the second operational amplifier is connected to the negative input thereof by means of a feedback resistor. The voltage produced at the output of the second operational amplifier is directly proportional to deviations in resistance of the transducer for a large range of such deviations. The output signal of the second operational amplifier contains a term dependent upon the input offset voltage of the first operational amplifier. However, the latter term is multiplied by a comparatively low gain factor, so that the transducer bridge amplifier circuitry is comparatively insensitive to the input offset voltage of the first operational amplifier and is consequently comparatively insensitve to thermal drift of the input offset voltage of the first operational amplifier.

In a second embodiment of the invention, the first node of the transducer bridge is not necessarily connected to a circuit which provides a low impedance or virtual ground. In the second embodiment of the invention, the second operational amplifier has its positive input connected to a first node rather than to a ground voltage conductor. The negative input of the second operational amplifier is connected to its output rather than to the first node. The output and negative input of the second operational amplifier are connected to a negative terminal of a voltage source which biases the transducer bridge by providing a positive voltage to a fourth node of the transducer bridge. The fourth node of the transducer bridge is coupled to the first and second nodes by means of first and second resistors, respectively. The current flowing into the first node is linearly proportional to deviations in resistance of the transducer for a large range of deviations and is comparatively insensitive to the input offset voltage and thermal drift thereof of the first and second operational amplifiers.

In a third embodiment of the invention, a current source rather than a voltage source is utilized to bias the transducer bridge. The current source is connected to the fourth node. The current flowing into the first node is linearly proportional to transducer deviations and is comparatively insensitive to input offset voltage and thermal drift thereof of the first operational amplifier.

DESCRIPTION OF THE INVENTION

The differences of the bridge amplifier circuit of the present invention over typical bridge amplifiers of the prior art can best be understood by a brief analysis of a typical prior art bridge amplifier prior to detailed description of the bridge amplifier circuitry of the present invention.

Figure 1:
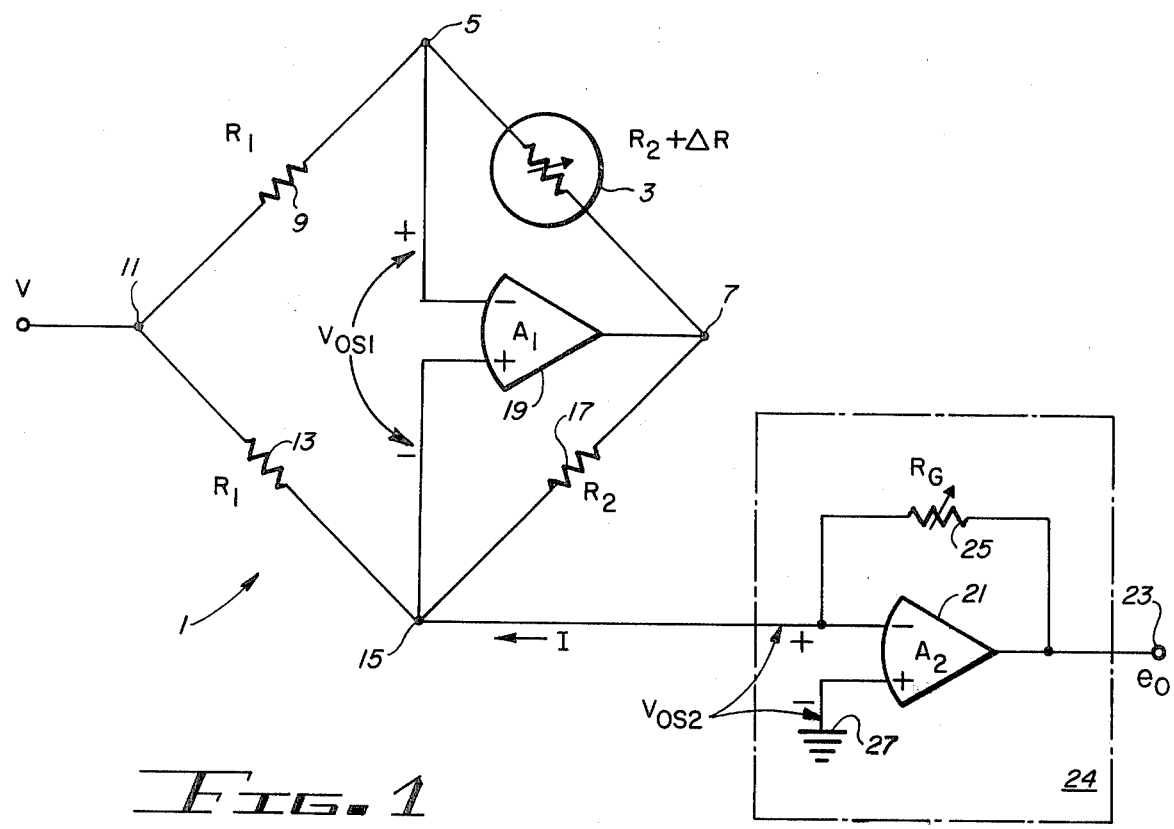
FIG. 1 is a partial circuit schematic of an embodiment of the present invention.
Figure 2:
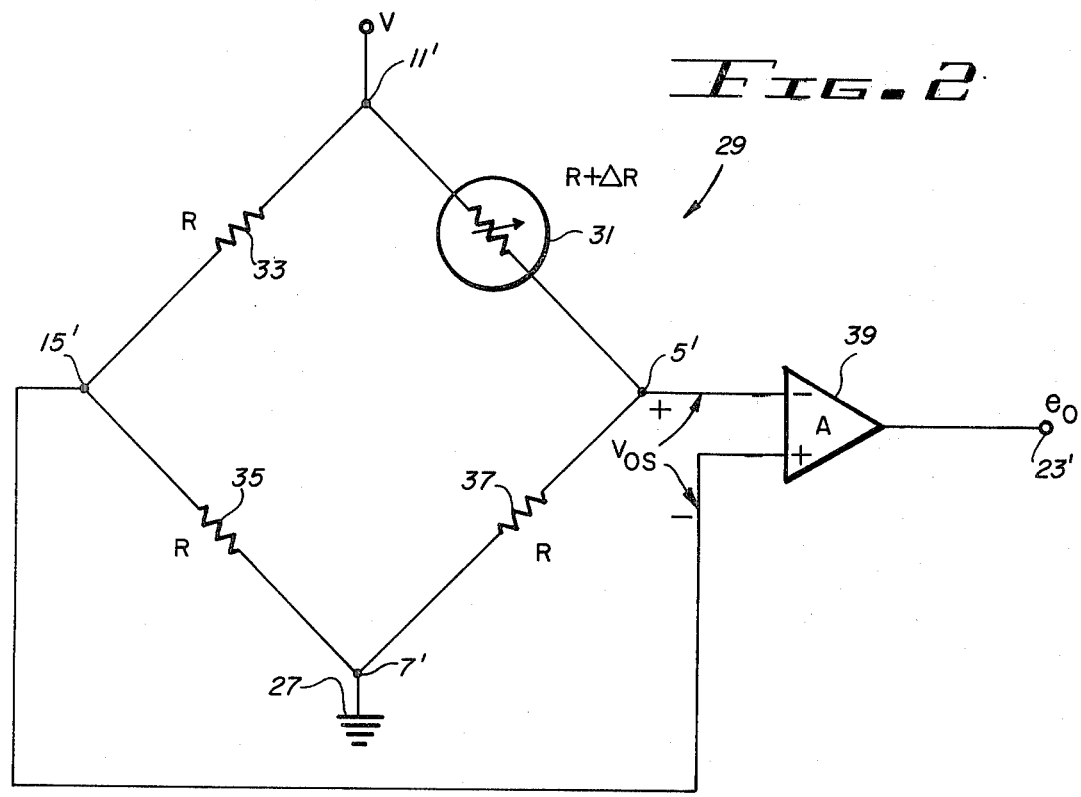
FIG. 2 is a circuit schematic diagram useful in pointing out the problems of the prior art overcome by the circuit of FIG. 1.

Referring first to FIG. 2, a typical prior art transducer bridge and associated amplifier are illustrated. Note that "primed" reference numerals are used to indicate nodes of the transducer bridge of FIG. 2 corresponding to the nodes of the transducer bridge of FIG. 1, subsequently described.

It is noteworthy that transducer bridges produce very low output signals that require exceptionally high-performance bridge monitoring amplifers to achieve accurate indications of transducer signals. A principle limitation in the accuracy of prior bridge monitor amplifiers is due to the thermal drift of the input offset voltage of the amplifier circuits utilized therein. Accuracy is further limited by the inherent non-linearity of most known transducer bridge monitor circuitry with respect to transducer deviation.

It can be shown that the output $e_o$ appearing at node 23' in FIG. 2 is described by the expression $$e_o = \frac{A}{4} \frac{\Delta RV/R}{1 + \Delta R/(2R)} - AV_{OS} \quad (1)$$

where $\Delta R$ is a transducer deviation, A is the amplifier gain of amplifier 39 (which is a differential amplifier), and $V_{OS}$ is the input offset voltage of differential amplifier 39. It should be noted that the transducer deviation $\Delta R$ appears in the denominator of equation (1), thereby resulting in a non-linear response for $e_o$. For small transducer deviations, $\Delta R$ is negligible, so the above expression is given by $$e_o \doteq \frac{A}{4} \frac{\Delta RV}{R} - AV_{OS} \quad (2)$$

Note that the term $\Delta RV/R$ is defined as the transducer deviation signal.

It can be seen from equation (2) that the transducer deviation signal $\Delta RV/R$ is amplified by only one-fourth of the gain A, while the offset voltage $V_{OS}$ is multiplied by the full amount of gain A. The non-linearity and sensitivity to amplifier input offset voltages are serious shortcomings typical of known bridge amplifiers. It should be noted that although the initial value of $V_{OS}$ can be compensated by well known biasing circuitry connected to the inputs of amplifier 39, thermal drift of $V_{OS}$ introduces new error which cannot be conveniently compensated.

Referring now to FIG. 1, a presently preferred embodiment of the invention is disclosed by circuitry 1, which includes a transducer bridge and bridge amplifier circuitry functioning as a bridge monitor connected to the transducer bridge. The transducer bridge includes transducer 3 connected between nodes 5 and 7, resistor 9 connected between nodes 5 and 11, resistor 13 connected between node 11 and output node 15, and resistor 17 connected between nodes 15 and 7. Supply voltage V is connected to node 11.

The bridge amplifier circuitry includes operational amplifier 19, which has a positive input connected to node 15 and a negative input connected to node 5. Operational amplifier 19 also has an output connected to node 7.

The bridge amplifier circuitry further includes a second operational amplifier 21 having a positive input connected to ground conductor 27 and a negative input connected to node 15. The output of operational amplifier 21 is connected to node 23. A feedback resistor 25 is connected between node 15 and output node 23.

Transducer 3 has a resistance given by the expression $R_2 + \Delta R$ where $\Delta R$ represents the transducer deviation. In a typical application, $R_2$ may have a value in the range from 150 ohms to approximately 1 kilohm and $\Delta R$ may typically have a value which is approximately 10% of $R_2$. Resistors 9 and 13 each have resistances $R_1$, which, in a typical application, may be approximately 5 kilohms if supply voltage V is approximately 5 volts. Resistor 17 has a value $R_2$, which, in a typical application, would be selected to have a resistance equal to an "un-deviated" or neutral resistance of transducer 3. The gain of operational amplifier 19 is equal to $A_1$. Operational amplifier 19 has an input offset voltage designated by $V_{OS1}$, having a polarity as indicated in FIG. 1. Operational amplifier 21 has a value of gain designated by $A_2$ and has an input offset voltage designated by $V_{OS2}$, the polarity of $V_{OS2}$ being indicated in FIG. 1. The value of resistor 25 is designated by $R_G$, which may typically have a value of approximately 20 kilohms.

The operation of circuitry 1 is such that operational amplifier 19 forces the transducer bridge circuitry to supply current I to operational amplifier 21 when the transducer bridge is unbalanced. Part of the current I is supplied from the bias voltage V through resistor 13. Another part of current I is supplied to node 15 from the output of amplifier 19 through resistor 17. When the transducer bridge circuitry is balanced, the two components of current in resistor 13 and resistor 17, respectively, are equal and opposite, so that the current I will be equal to zero. When the transducer bridge circuitry is unbalanced due to transducer deviation $\Delta R$ the two currents through resistors 13 and 17 are unequal, and their difference is equal to I.

The operation of the transducer bridge and bridge amplifier circuitry of FIG. 1 can best be understood by means of the following analysis, which develops the equation for the current I and the expression for the output voltage $e_o$ appearing on node 23.

First, it should be noted that amplifier 21 and feedback resistor 25, as connected in FIG. 1, function as a current-to-voltage converter which converts current I into ouput voltage $e_o$. Since the positive input of amplifier 21 is at ground volts or zero volts, the negative input of amplifier 21 is also at zero volts, since the voltage difference between the positive and negative inputs of an operational amplifier is ordinarily negligible. Thus, node 15 is at a virtual ground voltage. Similarly, the voltage differences between the positive and negative inputs of operational amplifier 19 is also negligible. Therefore, for purposes of a DC analysis, node 5 is also at zero volts. Thus, the current flowing through resistor 9 from node 11 to node 5 is equal to $V/R_1$. Since the current flowing into the negative input of operational amplifier 19 is negligible, the current flowing from node 5 through transducer 3 to node 7 is also equal to $V/R_1$. The voltage between nodes 5 and 7 is thus given by the expression $$\frac{V(R_2 + \Delta R)}{R_1}$$

Consequently, the voltage of node 7 is equal to $$\frac{-V(R_2 + \Delta R)}{R_1}$$

Consequently, the current flowing through resistor 17 from node 15 to node 7 is given by the expression $$\frac{V(R_2 + \Delta R)}{R_1 R_2}$$

Consequently, the current I is given by the expression $$I = \frac{\Delta R V}{R_1 R_2} \tag{3}$$

neglecting the effects of $V_{OS1}$, the input offset voltage of operational amplifier 19.

The component of current I due to $V_{OS1}$ is equal to $-V_{OS1}/R_1$. Consequently, the final expression current I is shown by the equation $$I = \frac{\Delta R V}{R_1 R_2} - \frac{V_{OS1}}{R_1} \tag{4}$$

It should be noted that the current I has a linear response to the transducer deviation $\Delta R$. In order that this condition be met, it is necessary that node 15 of FIG. 1 must be returned to a low impedance point such as a virtual ground voltage so that the current I does not cause node 15 to vary significantly from zero volts. The disclosed current-to-voltage converter (designated by reference numeral 24) includes operational amplifier 21 and resistor 25, and provides an output equal to the product of current I and the value of resistor 25. Assuming the input current of operational amplifier 21 to be zero, the output voltage $e_o$ is then given by the equation $$e_o = \frac{R_G}{R_1} \left( \frac{\Delta R V}{R_2} - V_{OS1} \right) + V_{OS2} \tag{5}$$

where $V_{OS2}$ is the input offset voltage of operational amplifier 21.

It is readily seen that $e_o$ retains the same linear relationship with $\Delta R$ as does current I. It should also be noted that the transducer deviation signal (previously defined) is equal to $\Delta R V / R_2$, and is multiplied by the same gain term $R_G/R_1$ as the bridge amplifier offset voltage $V_{OS1}$. This is a great improvement over the previously described prior art bridge amplifiers, wherein the transducer signal is multiplied by only one-fourth of the gain by which the bridge amplifier offset voltage is multiplied. Thus, the bridge amplifier circuitry of FIG. 1 achieves a 4:1 reduction in sensitivity to bridge amplifier offset voltage and thermal drift thereof. The input offset voltage $V_{OS2}$ of amplifier 21 is not amplified, and is therefore negligible.

The bridge amplifier circuitry of FIG. 1 can be readily constructed to obtain very high accuracy performance utilizing an inexpensive operational amplifier, such as the Burr-Brown 3510precision operational amplifier which costs only approximately fifteen dollars to implement operational amplifier 19. A very low cost operational amplifier, such as the Fairchild 741, which costs only approximately one dollar, can be used to implement operational amplifier 21.

Node 15 of the embodiment of the invention shown in FIG. 1 must be returned to a low impedance point, such as a virtual ground voltage, so that the current I does not create voltage swings at output node 15 which would alter voltages across the four bridge elements. It can be readily seen that connecting node 15 to a high impedance, rather than to the virtual ground provided by operational amplifier 21 and feedback resistor 25, would result in a voltage swing at node 15 due to incremental variations in current I (which variations in turn are due to transducer deviation $\Delta R$). Such voltage variations at output node 15 would alter the voltages across resistors 9 and 13. This in turn would produce corresponding variations of currents flowing through transducer 3 and resistor 17. It can be shown by analysis that output current I would be non-linearly related to transducer deviation $\Delta R$ if a large impedance were connected between output node 15 and ground because of the above variations in currents through resistors 9 and 13.

Figure 3:
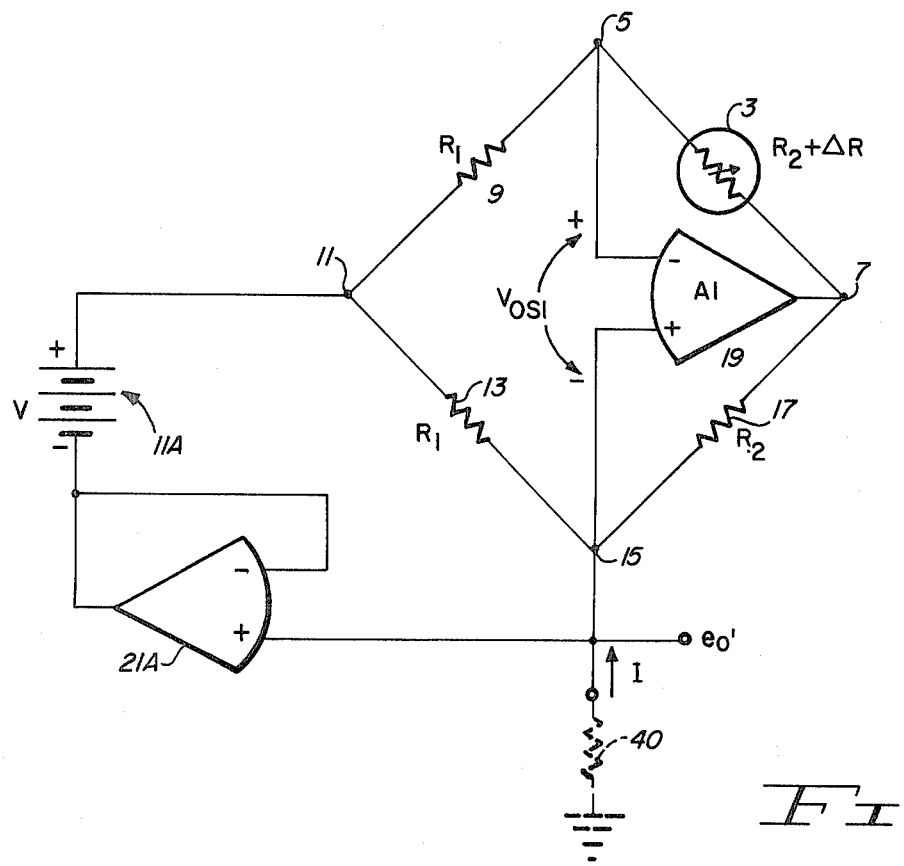
FIG. 3 is a circuit schematic of another embodiment of the invention.
Figure 4:
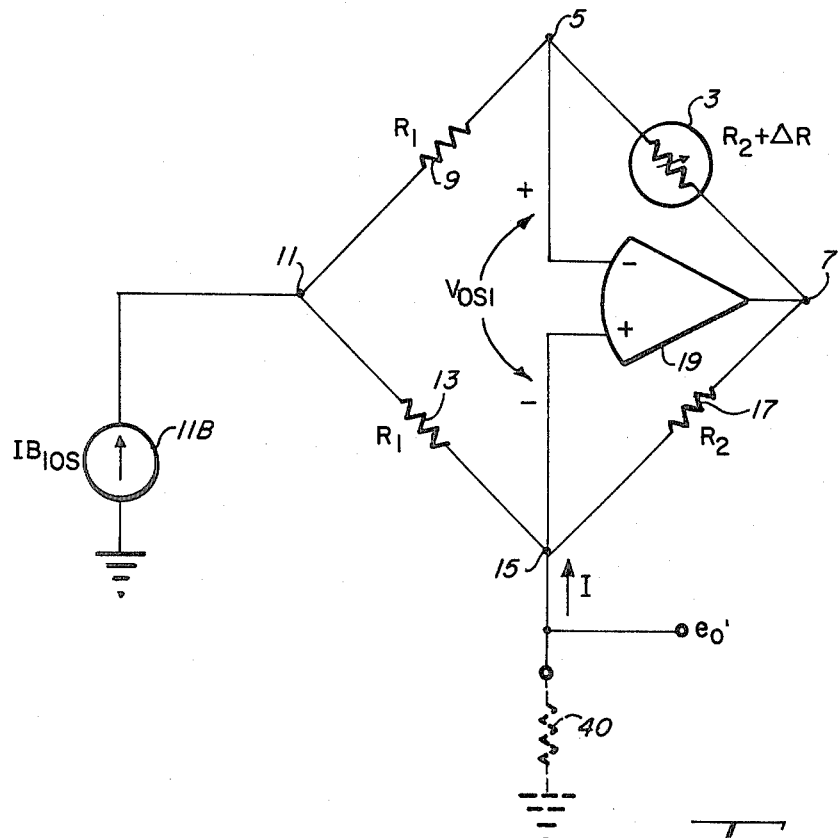
FIG. 4 is a circuit schematic of yet another embodiment of the invention.

Two other circuit techniques which preserve the linear response of output current I with respect to transducer deviation ΔR and the low sensitivity of output current I with respect to input offset voltage drift of operational amplifier 19 are shown in the circuits of FIGS. 3 and 4. These two techniques retain the precise linear relationship of current I to transducer deviation ΔR and also precisely retain the low sensitivity of current I to input offset voltage and drift thereof previously described for the circuit of FIG. 1.

Referring now to FIG. 3, it is seen that the bridge resistors, the transducer, and amplifier 19 are connected in the same manner as in FIG. 1. However, output node 15, rather than node 23 of FIG. 1, is utilized as the bridge amplifier output. Node 15 is connected to the positive input of amplifier 21A. The output and negative input of operational amplifier 21A are connected to the negative terminal of voltage source 11A; the positive terminal of voltage source 11A is connected to node 11. It can be readily seen that if a large load resistance 40 is connected between node 15 and ground, so that variations in current I cause corresponding variations in the voltage at node 15, operational amplifier 21A causes such voltage variations to be applied to the negative terminal of voltage source 11A. Consequently, the voltage variations at node 15 are added to voltage V at node 11. Thus, it can be seen that incremental voltage creations at node 15 do no produce corresponding variations in current through resistors 9, 13, 17 and transducer 3. It can be shown by analysis that the current I is linearly related to transducer deviation and has low sensitivity to input offset voltage drift in precisely the same manner as the corresponding current I in the circuit of FIG. 1. If a voltage output (rather than a current output) is desired for the transducer bridge of FIG. 3, an inexpensive differential amplifier can be connected to node 15 to produce an output voltage which is linearly proportional to transducer deviation and comparatively insensitive to input offset voltage and drift.

Referring now to FIG. 4, a third embodiment of the invention utilizes a constant current source 11B to provide a constant bias current into node 11. This causes the current in bridge resistors 9, 13 and 17 and in transducer 3 to be independent of incremental voltage variations across load resistance 40. Such incremental voltage changes at node 15 cannot alter the output of biasing current source 11B because of the nearly infinite output resistance of current source 11B. Therefore, the current supplied to bridge resistors 9 and 13 cannot be altered by voltage variations at node 15. Consequently, the current in transducer 3 and also output current I remain unaffected by voltage variations at node 15. The linear relationship between output current I and transducer deviation ΔR is the same as for the circuits of FIGS. 1 and 3; the sensitivity of output current I to input offset voltage drift is also structurally identical to that of the circuits of FIGS. 1 and 3.

While the invention has been described with reference to a presently preferred embodiment thereof, various alternate arrangements of elements may be made by those skilled in the art without departing from the true spirit and scope of the invention, which is understood to be limited only by the appended claims.

I claim:

1. A bridge amplifier circuit for linearly amplifying a transducer deviation signal produced by variations in resistance of a transducer of a transducer bridge, said transducer bridge including first, second, third, and fourth nodes, said transducer being connected between said second and third nodes, first resistance means being connected between said second and fourth nodes, second resistance means being connected between said fourth node and said first node, third resistance means being connected between said first node and said third node, a power supplying conductor being connected to said fourth node, said bridge amplifier circuit comprising in combination:
   a. first amplifier means having a positive input, a negative input, and an output coupled to said first, second, and third nodes, respectively, for producing an increased or decreased current through said third resistance means in response to a positive variation in said transducer resistance or a negative variation in said transducer resistance, respectively, said increased or decreased current in said third resistance means acting to maintain said transducer bridge in a balanced voltage condition; and
   b. constant current maintaining means coupled between said first node and said fourth node for maintaining constant current in said first and second resistance means, whereby current flowing into or out of said bridge amplifier circuit through said first node is linearly related to said variations in resistance of said transducer.

2. The bridge amplifier circuit of claim 1 wherein said first amplifier means includes a first operational amplifier.

3. The bridge amplifier circuit of claim 2 wherein said first resistance means and said second resistance means are resistors having equal resistance and wherein said third resistance means has a resistance equal to an undeviated resistance value of said transducer.

4. The bridge amplifier circuit of claim 2 wherein said constant current maintaining means includes low impedance means coupled between said first node and a ground voltage conductor for ensuring that only negligible voltage signals are produced at said first node.

5. The bridge amplifier circuit of claim 4 wherein said low impedance means includes second amplifier means having a negative input coupled to said first node, a positive input coupled to said ground voltage conductor, and an output coupled to said negative input of said second amplifier means by a feedback element.

6. The bridge amplifier circuit of claim 5 wherein said second amplifier means includes a second operational amplifier, and wherein said positive and negative inputs of said first amplifier means are directly connected to said first node and said second node, respectively.

7. The bridge amplifier circuit of claim 2 wherein a constant voltage source having a first polarity terminal and a second polarity terminal has its positive terminal connected to said power supplying conductor and wherein said constant current maintaining means includes second amplifier means having a first input connected to said first node and an output connected to said negative terminal of said constant voltage source for producing voltage variations on said fourth node, substantially equal to any voltage variations on said first node.

8. The bridge amplifier circuit of claim 7 wherein said second amplifier means includes a second operational amplifier having an output and a positive and a negative input, said negative input of said second operational amplifier being connected to said second polarity terminal of said constant voltage source, said positive input of said second operational amplifier being connected to said first node.

9. The bridge amplifier circuit of claim 2 wherein said constant current maintaining means includes a constant current source connected to said power supplying conductor.

10. The bridge amplifier circuit of claim 2 wherein the positive input of said first operational amplifier is directly connected to said first node and the negative input of said first operational amplifier is directly connected to said second node.

* * * * *